United States Patent
Balashov et al.

(10) Patent No.: US 10,601,423 B2
(45) Date of Patent: Mar. 24, 2020

(54) LOW-VOLTAGE DIFFERENTIAL SIGNALING (DIFFERENTIAL SIGNALING) DRIVER CIRCUIT AND METHOD OF ENABLING AND DISABLING A DIFFERENTIAL SIGNALING DRIVER CIRCUIT

(71) Applicant: FREESCALE SEMICONDUCTOR, INC., Austin, TX (US)

(72) Inventors: Alexey Michailovich Balashov, Frankfurt (DE); Andrey Evgenevich Malkov, Zelenograd (RU)

(73) Assignee: NXP USA, INC., Austin, TX (US)

( * ) Notice: Subject to any disclaimer, the term of this patent is extended or adjusted under 35 U.S.C. 154(b) by 351 days.

(21) Appl. No.: 15/035,544

(22) PCT Filed: Nov. 28, 2013

(86) PCT No.: PCT/RU2013/001067
§ 371 (c)(1),
(2) Date: May 10, 2016

(87) PCT Pub. No.: WO2015/080613
PCT Pub. Date: Jun. 4, 2015

(65) Prior Publication Data
US 2016/0315617 A1    Oct. 27, 2016

(51) Int. Cl.
*H03K 19/0185* (2006.01)
*H03K 19/003* (2006.01)
(Continued)

(52) U.S. Cl.
CPC ... *H03K 19/018528* (2013.01); *H03F 1/0222* (2013.01); *H03F 1/0233* (2013.01);
(Continued)

(58) Field of Classification Search
CPC ............................................. H03K 19/018528
See application file for complete search history.

(56) References Cited

U.S. PATENT DOCUMENTS 5,194,821 A    3/1993  Brambilla et al.
5,654,668 A    8/1997  Botti et al.
(Continued)

OTHER PUBLICATIONS

International Search Report dated Aug. 27, 2014 from Application No. PCT/RU2013/001067.

*Primary Examiner* — Lincoln D Donovan
*Assistant Examiner* — Colleen J O Toole

(57) ABSTRACT

A Low-Voltage Differential Signaling (differential signaling) driver circuit (10) comprising enable circuitry for enabling and disabling the differential signaling driver circuit (10) in accordance with an control signal is described. The differential signaling driver circuit (10) comprises: a differential output (12, 13) connected or connectable to a differential signaling receiver circuit via a differential transmission line; current control circuitry (14) for driving a signal current through the differential output (12, 13) in accordance with a driver signal; feedback circuitry (16) for driving the current control circuitry (14) to counteract a difference between a common mode voltage of the differential output (12, 13) and a reference voltage from a reference voltage provider; and the enable circuitry (18). The feedback circuitry (16) comprises a common mode node (20) for providing the common mode voltage (Vcm), a reference input (22) connected or connectable to the reference voltage provider, and a feedback input (24). The enable circuitry (18) is arranged to connect the feedback input (24) to the common mode node (20) when the differential signaling driver circuit (10) is in an enabled state and to the reference voltage provider when the differential signaling driver circuit (10) is in a disabled state. A method of enabling
(Continued)

(5.1) and disabling (5.2) a Low-Voltage Differential Signaling (differential signaling) driver circuit (10) is also proposed.

20 Claims, 5 Drawing Sheets

(51) Int. Cl.
*H03F 3/45* (2006.01)
*H03F 1/02* (2006.01)
*H03F 1/22* (2006.01)

(52) U.S. Cl.
CPC ......... *H03F 1/223* (2013.01); *H03F 3/45381* (2013.01); *H03F 3/45659* (2013.01); *H03F 3/45946* (2013.01); *H03K 19/00361* (2013.01); *H03K 19/018521* (2013.01); *H03F 2203/45418* (2013.01); *H03F 2203/45424* (2013.01); *H03F 2203/45431* (2013.01)

(56) References Cited

U.S. PATENT DOCUMENTS

| | | |
|---|---|---|
| 6,265,941 B1 | 7/2001 | Lopata |
| 7,034,574 B1 | 4/2006 | Li |
| 7,304,494 B2 | 12/2007 | Wong et al. |
| 8,653,856 B2* | 2/2014 | Piepenstock ... H03K 19/018528 326/115 |
| 9,362,915 B1* | 6/2016 | Phillippe ............ H03K 19/0175 |
| 2003/0085737 A1 | 5/2003 | Tinsley et al. |
| 2009/0273375 A1 | 11/2009 | Luich |
| 2010/0289579 A1* | 11/2010 | Cassia ...................... H03F 3/19 330/251 |
| 2012/0162189 A1* | 6/2012 | Ebuchi ............ H03K 19/00361 345/212 |

* cited by examiner

LOW-VOLTAGE DIFFERENTIAL SIGNALING (DIFFERENTIAL SIGNALING) DRIVER CIRCUIT AND METHOD OF ENABLING AND DISABLING A DIFFERENTIAL SIGNALING DRIVER CIRCUIT

FIELD OF THE INVENTION

This invention relates to a differential signaling driver circuit and to a method of enabling and disabling a differential signaling driver circuit.

BACKGROUND OF THE INVENTION

Differential signaling is a way of transmitting a differential signal from a transmitter to a receiver via a differential transmission line, e.g., via a pair of wires, e.g., copper wires. A differential signaling driver circuit drives an electrical current through the transmission line in accordance with a driver signal. The electrical current in the transmission line is referred to herein as the signal current. The driver signal may, for example, be provided by a voltage, an electrical current or any other suitable physical quantity.

A differential signaling receiver circuit may comprise a resistive bridge connected across the differential output of the transmission line, i.e., between the two conductors of the transmission line at the end of the transmission line. The electrical current injected into the transmission line by the differential signaling driver circuit thus translates into a voltage across the resistive bridge at the end of the transmission line. This voltage may be further processed or analysed by the differential signaling receiver circuit or by circuitry connected to the differential signaling receiver circuit.

The driver signal is usually a bi-level signal, i.e. a binary signal. However, a differential signaling driver circuit may, in principle, be capable of translating any kind of waveform of the driver signal into a corresponding waveform of the signal current. In other words, a differential signaling driver circuit may be suitable for both continuous (i.e., analogue) and discrete (i.e., digital) driver signals.

Differential signaling may be performed in a low-voltage manner when a differential signal of low voltage amplitude is superimposed on a common mode DC voltage. For example a differential signal with a maximum amplitude of 0.5 V or less, e.g. 350 mV may be imposed on a common mode voltage of 1.5 V or less, such as 1.2 V or less, e.g. 0.9 V or less, e.g. 0.4 V. This is generally referred to as LVDS, for which several different standards have been developed, such as IEEE 1596.3, ANSI/TIA/EIA-644-A and several variations such as M-LVDS, sub-LVDS, etc.

Differential signaling driver circuits are described, for example, in U.S. Pat. No. 7,034,574 B1 by Li and U.S. Pat. No. 7,304,494 B2 by Wong et al.

SUMMARY OF THE INVENTION

The present invention provides a differential signaling driver circuit and a method as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, same reference numbers refer to the same or similar parts. Elements in the FIGs. are illustrated for simplicity and clarity and have not necessarily been drawn to scale.

DETAILED DESCRIPTION OF THE PREFERRED EMBODIMENTS

Because the apparatus implementing the present invention is, for the most part, composed of electronic components and circuits known to those skilled in the art, circuit details will not be explained in any greater extent than that considered necessary for the understanding and appreciation of the underlying concepts of the present invention and in order not to obfuscate or distract from the teachings of the present invention.

Figure 1:
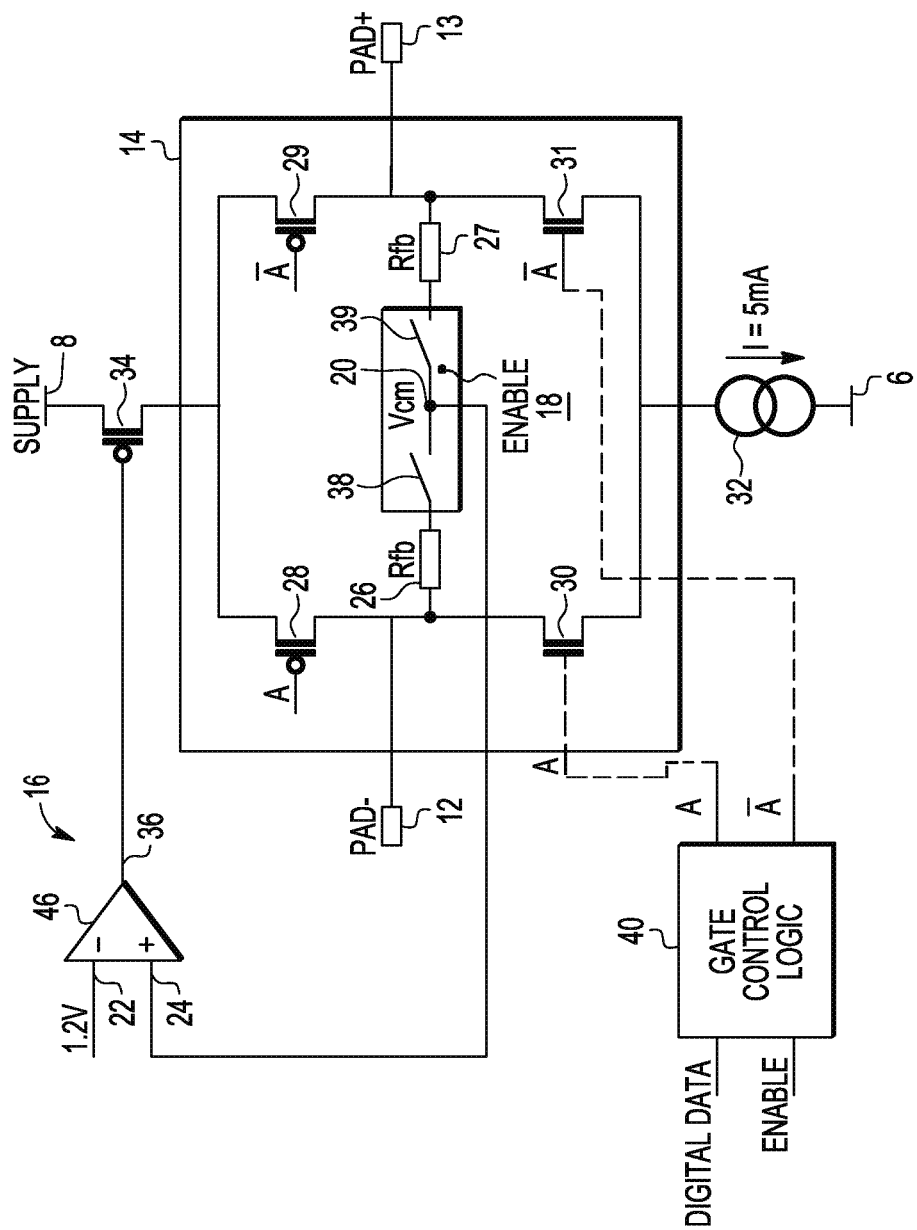
FIG. 1 shows a circuit diagram of an example of a differential signaling driver circuit 10.

Referring now to FIG. 1, an example of a differential signaling driver circuit 10 is schematically shown. The differential signaling driver circuit 10 may for example be a low-voltage differential signaling driver circuit 10 suitable for low voltage differential signaling, for example as compliant with a LVDS standard, such as IEEE 1596.3 or ANSI/TIA/EIA-644-A. The differential signaling driver circuit 10 may comprise a differential output 12, 13 for driving the signal current. The differential output 12, 13 comprises a first output terminal 12 and a second output terminal 13. The output terminals 12, 13 may, for example, be provided by contact pads, contact pins or any other kind of conductive element connectable to an input of a differential transmission line. The differential signaling driver circuit 10 comprises current control circuitry 14 for controlling the signal current in accordance with a driver signal A. The driver signal A may, for example, be a driver voltage for controlling a voltage controlled control element, e.g., voltage controlled switches 28, 29, 30, 31, of the current control circuitry 14. In other words, each of the switches 28, 29, 30, 31 may be turned on and off in accordance with the driver signal A.

In the example, the differential signaling driver circuit comprises gate control logic 40 for generating the driver signal A and its inverse, an inverted driver signal $\overline{A}$ in accordance with, e.g., a digital data input stream. The digital data input stream may thus be translated into the driver signal A which in turn may be translated into the signal current injected into the transmission line (not shown) which connects the differential signaling receiver circuit to the differential signaling driver circuit 10.

The differential signaling driver circuit 10 further comprises feedback circuitry 16 for driving the current control circuitry 14 to counteract a difference between a common mode voltage Vcm of the differential output 12, 13 and a reference voltage from a reference voltage provider (not shown). In the example, the reference voltage is 1.2 volts above a low side voltage provider 6, e.g., ground. However, it will be apparent that other voltages suitable for the specific implementation may be used as well. The current circuit element has a control input at which a voltage cab be provided and a current output at which the current circuit element provides a current which is controlled, e.g. by the voltage applied, and e.g. proportional to the voltage. The reference voltage provider may, for example, be a node of a voltage divider connected between a low side voltage provider 6 and a high side voltage provider 8. The low side voltage provider 6 and the high side voltage provider 8 may, for example, be the terminals of a battery or other kind of DC power supply.

The differential signaling driver circuit 10 further comprises enable circuitry 18 for enabling and disabling the differential signaling driver circuit 10 in response to a control signal, e.g. which indicates 'enable' when it has a first value and which indicates 'disable when it has a second value different from the first value. The first value may for example a first binary value and the second value the opposite binary value. Thus, the enable circuitry 18 enables the differential signaling driver circuit 10 in response to receiving the control signal indicating 'enable' and the enable circuitry 18 disables the differential signaling driver circuit 10 in response to receiving the control signal indicating "disable".

When the differential signaling driver circuit is enabled, the differential signaling driver circuit 10 is operational to inject the signal current into the differential signaling receiver circuit connected to the differential output 12,13, and to control the signal current in accordance with the driver signal A. In contrast, when the differential signaling driver circuit is disabled (in response to receiving the control signal indicating "disable"), one or more of its components are in a disabled state and the differential signaling driver circuit is then not capable of operating normally. The disabled state of the differential signaling driver circuit 10 may be considered a standby state, that is, a state in which the differential signaling driver circuit 10 is kept on power but does not provide its full functionality.

Depending on the specific implementation, the disabled state of the differential signaling driver circuit 10 may serve different purposes. In one example, the differential signaling driver circuit 10 may intentionally be disabled to interrupt the transmission of data from the differential signaling driver circuit 10 to the differential signaling receiver circuit. For example, the differential signaling driver circuit 10 may be disabled in order to save power without switching the differential signaling driver circuit 10 entirely off in response to detecting interference of the differential signaling driver circuit 10 with another device. This can be useful, for example, in the event of a temporary interruption of the digital data input stream.

The feedback circuitry 16 may be implemented in any manner suitable for the specific implementation. The feedback circuitry 16 may be arranged to minimize the difference between the reference voltage and the common mode voltage Vcm by controlling the current control element 34 in a negative feedback loop. As shown in FIG. 1, the feedback circuitry may comprise a common mode node 20, a reference input 22, and a feedback input 24. The common mode node 20 may, for example, be connected between the first terminal 12 and the second terminal 13 of the differential output 12, 13, in order to feedback the common mode voltage. The reference input 22 is connected or connectable to the reference voltage provider in order to receive the reference voltage (not shown). The operational amplifier 46 has a first input providing the reference input 22, a second input providing the feedback input 24, and the output 36 connected to control the current control element 34. More specifically, the operational amplifier 46 may be arranged to deliver an amplifier output voltage at its output 36 in dependence of a voltage difference between the first input and the second input, that is, in dependence of the voltage difference between the reference input 22 and the feedback input 24.

In the example, the feedback circuitry 16 comprises an operational amplifier 46 and a current control element 34. The current control element 34 may, for example, be connected between the high side voltage provider 8 and the current control circuitry 14. In the example, the current control element 34 is a field effect transistor (FET), e.g., a PMOS FET with a source connected to the high side voltage provider 8, a drain connected to the current control circuitry 14, and a gate connected to an output 36 of the operational amplifier 46. In another example (not shown), the current control element 34 can be an NMOS FET connected between the current control circuitry 14 and the low side voltage provider 6, while the current source 32 is connected between the high side voltage provider 8 and the current control circuitry 14.

Still referring to FIG. 1, the differential signaling driver circuit 10 may operate as follows, when enabled and when connected to a differential signaling receiver circuit via the differential outputs 12, 13. When the driver signal A is high, switches 28 and 31 are on, i.e., conductive, while switches 29 and 30 are off, i.e., not conductive. The current source 32 then drives a constant current from the high side voltage provider 8 to the low side voltage provider 6 through the current control element 34, the switch 28, the output terminal 12, the differential signaling receiver circuit, the output terminal 13, and the switch 31. The current drawn by the current source 32 thus traverses the differential signaling receiver unit (not shown) in a forward direction. In contrast, when the driver signal A is low, the switches 28 and 31 are off and the switches 29 and 30 are on. The current source 32 then drives a suitable current from the high side voltage provider 8 to the low side voltage provider 6 through the current control element 34, the switch 29, the output terminal 13, the differential signaling receiver circuit, the output terminal 12, and the switch 30. In this configuration, the current drawn by the current source 32 thus traverses the differential signaling receiver circuit in a reverse direction opposite to the forward direction. The current may have any suitable value, and for example be 10 mA or less, such as 5 mA. The current may have the same value for the reverse direction and the forward direction or be different for both directions.

When the differential signaling driver circuit 10 is enabled, a resistive bridge may be connected between the output terminal 12 and the output terminal 13, a midpoint 20 of the resistive bridge serving as a pick-off point for providing the common mode voltage. This pick-off point, i.e., the midpoint of the resistive bridge, is referred to herein as the common mode node 20. The common mode node 20 may be considered the midpoint of the resistive bridge in the sense that the electrical resistance between the common mode node 20 and the output terminal 12 equals the electrical resistance between the common mode node 20 and the output terminal 13. For example, the common mode node 20 may be connected to the output terminal 12 by a first resistor 26 of resistance RFB and to the output terminal 13 by a second resistor 27 of the resistance RFB. It may thus be ensured that the voltage at the common mode node 20 is indeed the common mode voltage of the differential output 12, 13, that is, the mean value of the voltage at the output terminal 12 and the output terminal 13. In other words, Vcm=(V1+V2)/2 wherein V1 and V2 are the voltage levels at the output terminal 12 and 13, respectively. In the example, the resistive bridge is part of an H bridge which comprises the resistive bridge and four legs, each leg comprising one of the switches 28, 29, 30, 31.

As shown in FIG. 1, the common mode voltage Vcm may be applied at the feedback input 24 of the feedback circuitry 16, thereby controlling the current control element 34 to provide more current when the common mode voltage Vcm is lower than the reference voltage and to provide less current when the common mode voltage Vcm is higher than the reference voltage.

When the differential signaling driver circuit 10 is disabled, e.g., in response to the control signal being low, the voltage at the feedback input 24 may drift. For example, when the voltage at the feedback input 24 is substantially equal to the reference voltage during the enabled state of the differential signaling driver circuit 10, it may drift away from the reference voltage.

For example, still considering FIG. 1, the switches 38 and 39 may be turned off when the differential signaling driver circuit 10 is disabled in order to reduce a leakage current across the resistive bridge and also to reduce a possible leakage current through the feedback input 24. In this example, the feedback loop is therefore disrupted when the differential signaling driver circuit 10 is disabled, allowing the voltage at the feedback input 24 to drift. In another example (not shown), the resistive bridge comprising the common mode node 20 is not disrupted when the differential signaling driver circuit 10 is disabled, but some other component, e.g., the operational amplifier 46, is turned off, also resulting in a disruption of the feedback loop and allowing the voltage at the feedback input 24 to drift.

This voltage drift may be reduced by a suitable operation of the enable circuitry. For example, the feedback input 24 and the reference input 22 may both be connected to the reference voltage provider when the differential signaling driver circuit 10 is disabled. The feedback input 24 may thus be provided with a voltage which as a predefined difference (ΔV) with the voltage provided to the reference input 22, with ΔV for example being zero. The feedback circuitry 16 may thus be pre-set to a state identical or similar to a state expected to be reached by negative feedback control when the differential signaling driver circuit is enabled. It has been observed that pre-setting the feedback circuitry 16 in this manner tends to reduce the enable time of the differential signaling driver circuit 10, that is, to reduce the duration of a transition from the disabled state to the enabled state.

Notably, pre-setting the feedback input 24 to the reference voltage, e.g. 1.2 volts, has been observed to make the common mode voltage of the differential output 12, 13 settle more rapidly at the reference voltage as compared to, for example, the circuit shown in FIG. 1. Furthermore, signal overshoot, distortions and oscillations of the common mode voltage (which may occur during a transition from the disabled to the enabled state) may be reduced. It has been found that an enable time of the differential signaling driver circuit 10 shorter than ten nanoseconds or even shorter than five nanoseconds may be achieved. The differential signaling driver circuit 10 may thus be arranged, for example, to meet a timing requirement of a media local bus interface, namely the requirement of providing valid data no later than, e.g., two clock cycles after an control signal, wherein the media local bus interface may have an operation frequency of up to 400 megahertz, for example.

Figure 2:
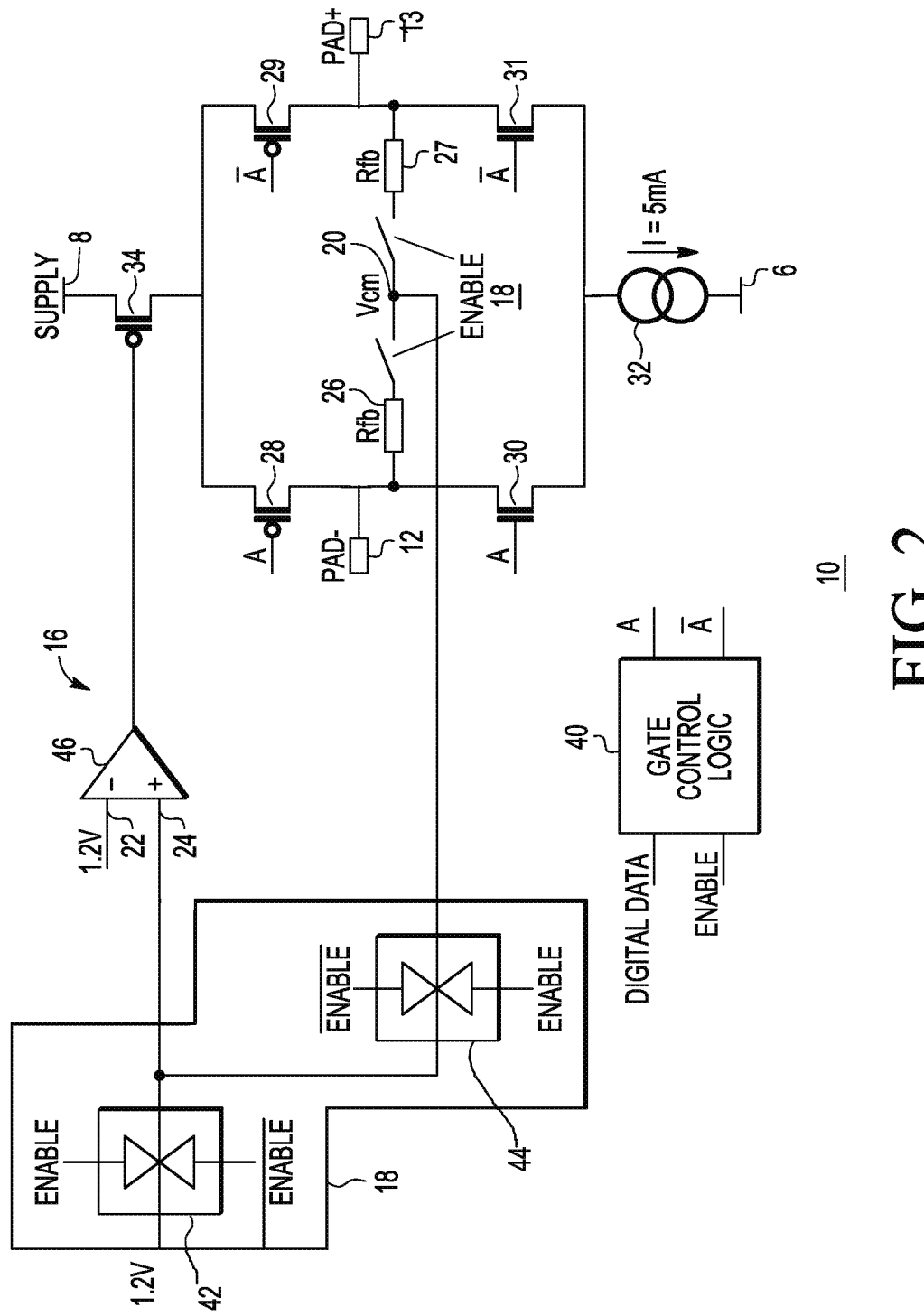
FIG. 2 shows a circuit diagram of another example of a differential signaling driver circuit.

The reference voltage may be provided to the feedback node 24 in any manner suitable for the specific implementation. For example, as shown in the example of FIG. 2, (in which the differential signaling driver circuit 10 may for example be a low-voltage differential signaling driver circuit 10 suitable for low voltage differential signaling, for example as compliant with a LVDS standard, such as IEEE 1596.3 or ANSI/TIA/EIA-644-A)., the enable circuitry 18 may further be arranged to connect the feedback input 24 to the common mode node 20 when the differential signaling driver circuit is in an enabled state and to the reference voltage provider (not shown) when the differential signaling driver circuit 10 is in a disabled state. The enable circuitry 18 may e.g. comprise a first switch 42 arranged to connect the feedback input 24 to the reference voltage provider when the control signal is negative and to isolate the feedback input 24 from the reference voltage provider when the control signal is positive (or high).

The enable circuitry 18 may further comprise a second switch 44 arranged to isolate the feedback input 24 from the common mode node 20 when the control signal is indicates 'enable' (e.g. negative (or low)) and to connect the feedback input 24 to the common mode node 20 when the control signal is 'disable' (e.g. positive (or high)). The second switch 44 may allow to avoid an electrical current from the reference voltage provider and through the common mode node 20 when the circuit 10 is disabled, such as for example in differential signaling driver circuits without switches between the common mode node 20 and the output terminals 12, 13. The first switch 42 and the second switch 44 may, for example, be transistors operated as switches, such as FETs.

Alternatively, or additionally, as in the example of FIG. 2, the common mode node 20 may be isolated from the differential output 12, 13 when the differential signaling driver circuit 10 is disabled. With such a design, the common mode node 20 may remain connected to the feedback node 24 when the differential signaling driver circuit 10 is disabled. This may be used as well when the differential signaling driver circuit 10 lacks the second switch 44.

Figure 3:
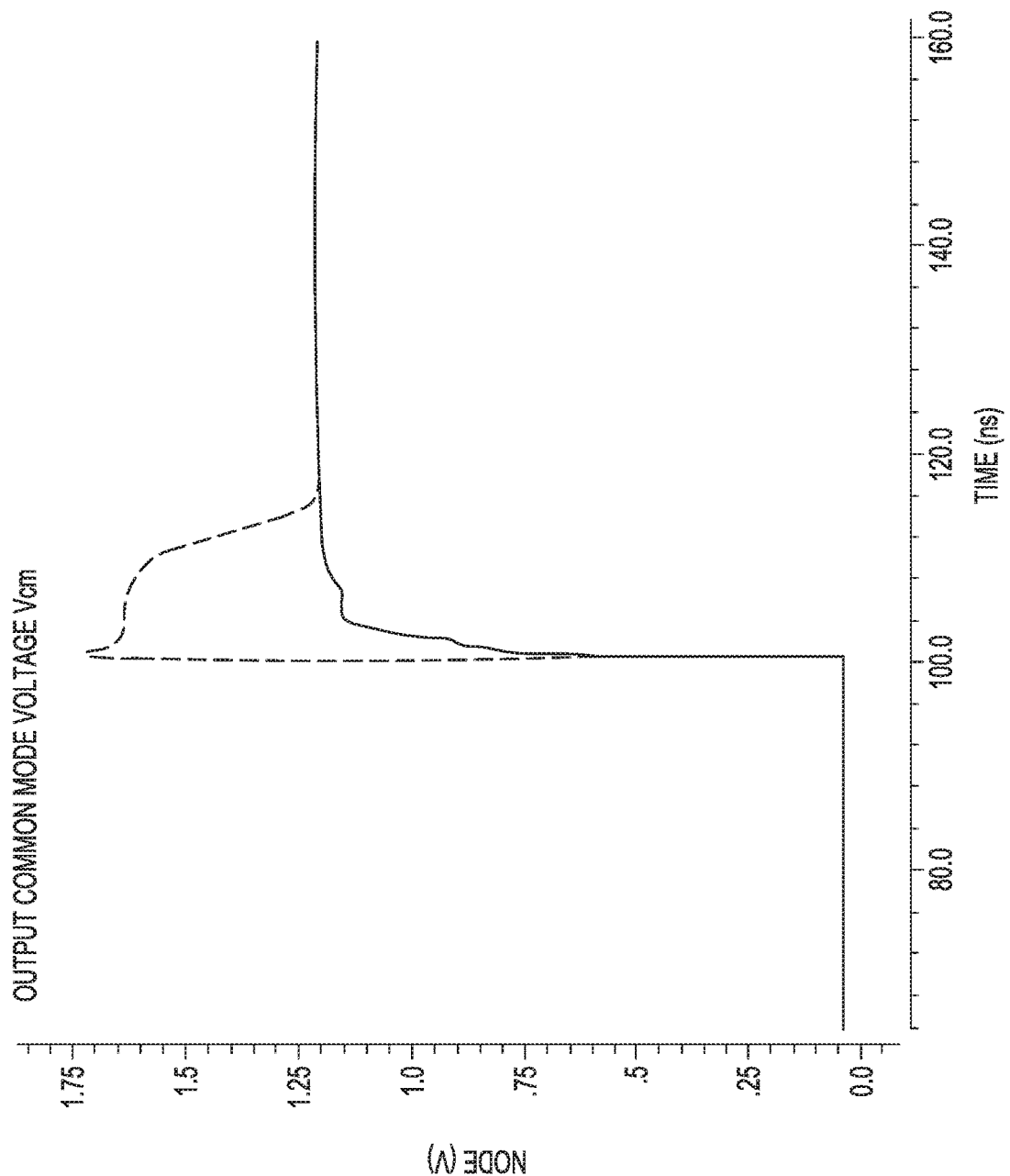
FIG. 3 shows a graph of a time dependence of the common mode voltage Vcm for the examples of FIGS. 1 and 2.
Figure 4:
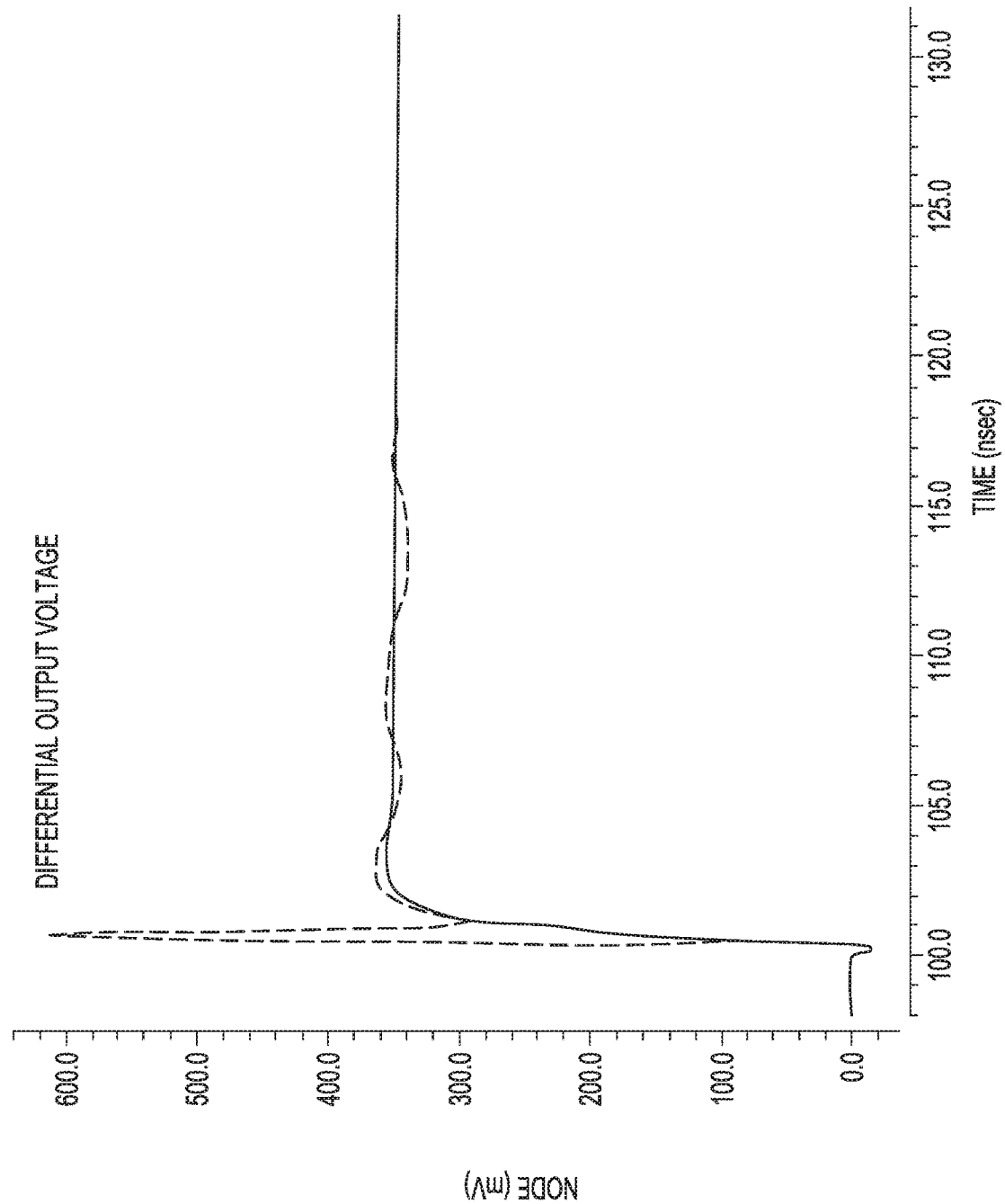
FIG. 4 shows a graph of a time dependence of the differential output voltages provided by the differential signaling driver circuits of FIGS. 1 and 2.

FIG. 3 illustrates the time dependence of the common mode voltage Vcm observed in an example of a differential signaling driver circuit of the kind described in reference to FIG. 1 (dashed line) and of the kind described in reference to FIG. 2 (continuous line). The transition time of the common mode voltage Vcm in the event of enabling the differential signaling driver circuit is seen to be significantly shorter (<10 ns) with the circuit of FIG. 2 as compared to the circuit of FIG. 1 (>20 ns). Furthermore, the overshoot is reduced. Referring to FIG. 4, a similar reduction of transition time and overshoot of the differential output voltage is seen as well.

Figure 5:
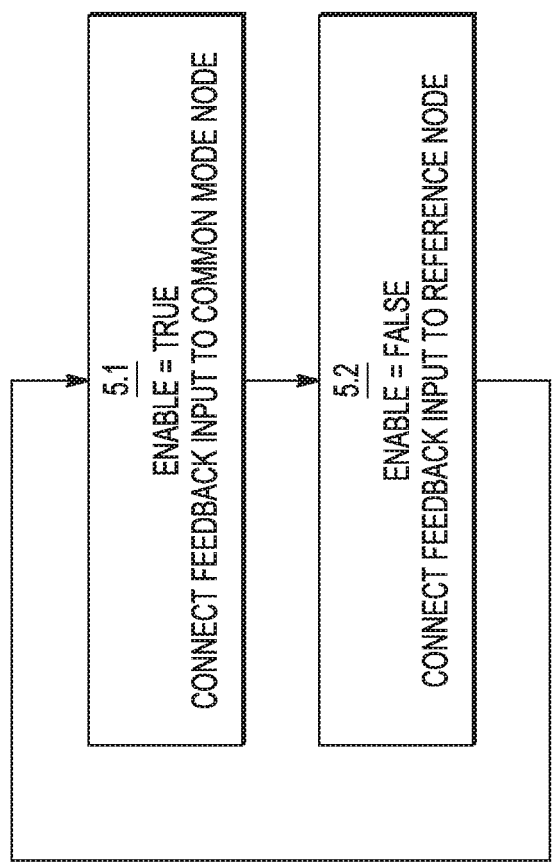
FIG. 5 shows a flow chart of an example of a method of enabling and disabling a differential signaling driver circuit.

An example of a method of enabling and disabling a differential signaling driver circuit 10 is schematically represented by the flow chart in FIG. 5. The differential signaling driver circuit 10, e.g., the one describe above in reference to FIG. 2, may be arranged to be enabled and disabled in accordance with a control signal. The control signal may, for example, be a binary signal, with values or levels true and false, or, equivalent, high and low, or one and zero. Enabling the differential signaling driver circuit 10 comprises setting the differential signaling driver circuit 10 into an enabled state, that is, a state in which the differential signaling driver circuit 10 is capable of driving the signal current through its output terminals 12 and 13 in accordance with the digital data input stream. In a variant of the example of a differential signaling driver circuit 10 shown in FIG. 2, the digital data input stream may be replaced by an analogue signal and the differential signaling driver circuit may be arranged to modulate the signal current in accordance with the analogue signal.

The method may start with enabling the differential signaling driver circuit 10 (Box 5.1). Enabling the differential signaling driver circuit may, for example, comprise enabling the resistive bridge between the output terminals 12 and 13, e.g., by turning the switches 38 and 39 on. Enabling (Box 5.1) the differential signaling driver circuit 10 further comprises connecting the feedback input 24 of the feedback circuitry 16 to the common mode node 20, thus applying the common mode voltage Vcm at the feedback input 24. Enabling (Box 5.1) the differential signaling driver circuit further comprises disconnecting the feedback input 24 from the reference voltage provider.

Enabling (Box 5.1) the differential signaling driver circuit 10 may be followed by disabling (Box 5.2) the differential signaling driver circuit 10. Disabling (Box 5.2) the differential signaling driver circuit 10 may, for example, comprise interrupting the resistive bridge between the output terminals 12 and 13, e.g., by turning the switches 38 and 39 off. Disabling the differential signaling driver circuit 10 further comprises connecting the feedback input 24 to the reference voltage provider. It may further comprise disconnecting the feedback input 24 from the common mode node 20. The operations of enabling and disabling the differential signaling driver circuit 10 may be repeated in an alternating manner.

In the foregoing specification, the invention has been described with reference to specific examples of embodiments of the invention. It will, however, be evident that various modifications and changes may be made therein without departing from the broader scope of the invention as set forth in the appended claims, and that the claims are not limited to the specific examples described above. For example, the connections may be any type of connection suitable to transfer signals from or to the respective nodes, units or devices, for example via intermediate devices. Accordingly, unless implied or stated otherwise the connections may for example be direct connections or indirect connections. Furthermore, although in the examples FET are shown, it will be apparent that other devices may be used when suitable, such as bipolar switches or MEMS switches.

Likewise, in alternate embodiments, those signals described as positive logic signals may be implemented as negative logic signals, and those signals described as negative logic signals may be implemented as positive logic signals.

The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

Although the invention has been described with respect to specific conductivity types or polarity of potentials, skilled artisans appreciated that conductivity types and polarities of potentials may be reversed.

Those skilled in the art will recognize that boundaries between the operations described with reference to FIG. 5 are merely illustrative. The multiple operations may be combined into a single operation, and/or a single operation may be distributed in additional operations. Moreover, alternative embodiments may include multiple instances of a particular operation, and the order of operations may be altered in various other embodiments.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

What is claimed is:

1. A differential signaling driver circuit, comprising:
a differential output connected or connectable to a receiver circuit via a differential transmission line;
current control circuitry for driving a signal current through the differential output in accordance with a driver signal;
feedback circuitry for driving the current control circuitry to counteract a difference between a common mode voltage of the differential output and a reference voltage from a reference voltage provider, the feedback circuitry comprises a common mode node for providing the common mode voltage, a reference input connected or connectable to the reference voltage provider, and a feedback input; and
enable circuitry for enabling and disabling the driver circuit in accordance with a control signal, which enable circuitry is arranged to connect the feedback input to the common mode node when the driver circuit is in an enabled state and to the reference voltage provider when the driver circuit is in a disabled state, wherein the enable circuitry is arranged to isolate the feedback input from the differential output through the common mode node when the driver circuit is in a disabled state.

2. The driver circuit of claim 1, wherein the enable circuitry comprises a switch operable to isolate the feedback from the reference voltage provider in response to the control signal being positive and to connect the feedback input to the reference voltage provider in response to the control signal being negative.

3. The driver circuit of claim 1, wherein the enable circuitry comprises a second switch operable to connect the feedback input to the common mode node in response to the control signal being positive and to isolate the feedback input from the common mode node in response to the control signal being negative.

4. The driver circuit of claim 1, comprising a resistive bridge connected or connectable across the differential output, for conducting a bridge current, wherein the common mode node is a midpoint of the resistive bridge.

5. The driver circuit of claim 4, wherein the current control circuitry is operable to control the direction of the bridge current in accordance with the driver signal.

6. The driver circuit of claim 5, wherein the current control circuitry comprises an H bridge which comprises the resistive bridge and four legs, each leg comprising a switch arranged to be turned on and off in accordance with the driver signal or its inverse.

7. The driver circuit of claim 1, wherein the feedback circuitry comprises an operational amplifier and a current control element, wherein the operational amplifier has a first input providing the reference input, a second input providing the feedback input, and an output connected or connectable to control the current control element in dependence of a voltage difference between the first input and the second input.

8. The driver circuit of claim 1, wherein the differential output is connected to a differential input of the differential transmission line.

9. The driver circuit of claim 1, wherein the reference voltage is 1.2 volts.

10. The driver circuit of claim 1, having an enable time not longer than ten nanoseconds.

11. The driver circuit of claim 1, wherein the driver circuit is implemented in an integrated circuit.

12. A method of driving a differential signaling circuit connected to a receiver circuit, the method comprising:
   current control circuitry driving a signal current through a differential output of the differential signaling circuit in accordance with a driver signal;
   feedback circuitry driving the current control circuitry to counteract a difference between a common mode voltage at a common mode node of the differential output and a reference voltage from a reference voltage provider provided to a reference input of the feedback circuitry; and
   alternatingly enabling the driver circuit, comprising connecting a feedback input of the feedback circuitry to the common mode node, and disabling the driver circuit, comprising connecting the feedback input to the reference voltage provider and isolating the feedback input from the differential output through the common mode node.

13. The method of claim 12, wherein disabling the driver circuit comprises controlling the current control circuitry to stop driving the signal current through the differential output.

14. The driver circuit of claim 3, comprising a resistive bridge connected or connectable across the differential output, for conducting a bridge current, wherein the common mode node is a midpoint of the resistive bridge.

15. The driver circuit of claim 3, wherein the feedback circuitry comprises an operational amplifier and a current control element, wherein the operational amplifier has a first input providing the reference input, a second input providing the feedback input, and an output connected or connectable to control the current control element in dependence of a voltage difference between the first input and the second input.

16. The driver circuit of claim 2, wherein the enable circuitry comprises a second switch operable to connect the feedback input to the common mode node in response to the control signal being positive and to isolate the feedback input from the common mode node in response to the control signal being negative.

17. The method of claim 12 wherein the isolating the feedback input from the differential output through the common mode node includes opening a switch in a path between the feedback input and a differential output terminal of the differential output though the common mode node.

18. The driver circuit of claim 1, wherein the enable circuitry comprises a switch located in a path between the feedback input and a differential output terminal of the differential output through the common mode node, the switch is closed when the driver circuit is in an enabled state and is open when the driver circuit is in a disabled state.

19. The driver circuit of claim 18 wherein the switch is located in a path between the feedback input and the common mode node.

20. The driver circuit of claim 18 wherein the switch is located in a path between the common mode node and the differential output terminal.

\* \* \* \* \*